(12) United States Patent
Chen et al.

(10) Patent No.: US 11,004,932 B2
(45) Date of Patent: May 11, 2021

(54) SEMICONDUCTOR DEVICE (71) Applicant: Mitsubishi Electric Corporation, Tokyo (JP)

(72) Inventors: Ze Chen, Tokyo (JP); Fumihito Masuoka, Tokyo (JP); Yuki Haraguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/843,715

(22) Filed: Apr. 8, 2020

(65) Prior Publication Data
US 2020/0388673 A1 Dec. 10, 2020

(30) Foreign Application Priority Data

Jun. 4, 2019 (JP) .............................. JP2019-104238

(51) Int. Cl.
*H01L 29/06* (2006.01)
*H01L 29/04* (2006.01)

(52) U.S. Cl.
CPC .......... *H01L 29/0638* (2013.01); *H01L 29/04* (2013.01)

(58) Field of Classification Search
CPC . H01L 29/0638; H01L 29/04; H01L 21/0415; H01L 21/76859
USPC ........................................................ 257/620
See application file for complete search history.

(56) References Cited

U.S. PATENT DOCUMENTS

2004/0232522 A1* 11/2004 Shimizu .............. H01L 29/7823
257/548
2009/0085116 A1* 4/2009 Aoki ................... H01L 29/0661
257/355
2009/0101974 A1* 4/2009 Saito ................... H01L 29/7811
257/342
2011/0006403 A1* 1/2011 Okumura ............ H01L 29/0661
257/620
2011/0115033 A1* 5/2011 Tamaki ............. H01L 29/66727
257/409
2011/0165763 A1* 7/2011 Mauder ................. H01L 29/861
438/478
2011/0233714 A1* 9/2011 Lu ....................... H01L 29/1095
257/493
2012/0138951 A1* 6/2012 Hayashi ............... H01L 29/7813
257/76
2013/0037851 A1* 2/2013 Gejo ................... H01L 29/0634
257/139

(Continued)

FOREIGN PATENT DOCUMENTS

JP 2013-038329 A 2/2013

*Primary Examiner* — Sheikh Maruf
(74) *Attorney, Agent, or Firm* — Studebaker & Brackett PC (57) ABSTRACT

The semiconductor device includes: a fourth impurity layer disposed in a state of being connected to the outermost peripheral second impurity layer and being separated from the first impurity layer between the outermost peripheral second impurity layer and the first impurity layer of the terminal portion, the fourth impurity layer having a second conductivity type and having an impurity concentration lower than an impurity concentration of the second impurity layer; an insulating film disposed on at least a part of the terminal portion, the insulating film having a first opening on the first impurity layer; and an electrode disposed on the insulating film, the electrode connected to the first impurity layer via the first opening.

8 Claims, 12 Drawing Sheets

(56) References Cited

U.S. PATENT DOCUMENTS

| | | | |
|---|---|---|---|
| 2014/0246721 A1* | 9/2014 | Lu | H01L 29/66734 |
| | | | 257/339 |
| 2015/0014741 A1* | 1/2015 | Chen | H01L 29/4236 |
| | | | 257/139 |
| 2016/0148875 A1* | 5/2016 | Okamoto | H01L 29/0646 |
| | | | 257/620 |
| 2020/0127082 A1* | 4/2020 | Chen | H01L 29/407 |

\* cited by examiner

| WITHSTAND VOLTAGE CLASS | W1 [μm] |
|---|---|
| 600V | 5 |
| 1.2kV | 15 |
| 1.7kV | 20 |
| 3.3kV | 35 |
| 4.5kV | 50 |
| 6.5kV | 75 |

| FORMING METHOD | ADVANTAGE | DISADVANTAGE |
|---|---|---|
| LOW ENERGY IMPLANTATION | CONTROL ACCURACY OF DOSE AMOUNT IS HIGH | IMPLANTATION DAMAGE OCCURS TO FRONT SURFACE |
| GAS DOPING | DOPING AND ACTIVATION ARE PERFORMED SIMULTANEOUSLY | TREATMENT TEMPERATURE IS HIGH |
| LIQUID TREATMENT | LOW DAMAGE DUE TO LOW TEMPERATURE TREATMENT | POOR UNIFORMITY, DOSE AMOUNT CONTROL IS DIFFICULT |

SEMICONDUCTOR DEVICE

BACKGROUND OF THE INVENTION

Field of the Invention

The present invention relates to a semiconductor device such as a power semiconductor device.

Description of the Background Art

Various techniques have been proposed for power semiconductor devices having a high breakdown voltage. For example, Japanese Patent Application Laid-Open No. 2013-38329 proposes a technique for increasing the breakdown voltage of a semiconductor device by disposing a plurality of P layers in a terminal portion of the front surface of a semiconductor substrate.

However, the technique of Japanese Patent Application Laid-Open No. 2013-38329 has a problem in that since the leakage current is relatively large, the heat generated in the off state of the semiconductor device is increased, and the loss of energy is also increased.

SUMMARY

The present invention has been made in view of the above problems, and an object of the present invention is to provide a technique capable of reducing the leakage current of a semiconductor device.

The present invention is a semiconductor device that includes: a semiconductor substrate having a surface on which a cell portion and a terminal portion surrounding the cell portion are defined, the semiconductor substrate having a first conductivity type; a first impurity layer disposed to surround the cell portion in an end portion of the terminal portion opposite to the cell portion, the first impurity layer having a first conductivity type and having an impurity concentration higher than an impurity concentration of the semiconductor substrate; a plurality of second impurity layers separated from each other and disposed to surround the cell portion in a portion other than the end portion of the terminal portion, the plurality of second impurity layers having a second conductivity type; at least one third impurity layer disposed between the plurality of second impurity layers of the terminal portion, the at least one third impurity layer having a second conductivity type and having an impurity concentration lower than an impurity concentration of the second impurity layer; a fourth impurity layer disposed in a state of being connected to the outermost peripheral second impurity layer and being separated from the first impurity layer between the outermost peripheral second impurity layer and the first impurity layer of the terminal portion, the fourth impurity layer having a second conductivity type and having an impurity concentration lower than an impurity concentration of the second impurity layer; an insulating film disposed on at least a part of the terminal portion, the insulating film having a first opening on the first impurity layer; and an electrode disposed on the insulating film, the electrode connected to the first impurity layer via the first opening.

The leakage current of the semiconductor device can be reduced.

These and other objects, features, aspects and advantages of the present invention will become more apparent from the following detailed description of the present invention when taken in conjunction with the accompanying drawings.

DESCRIPTION OF THE PREFERRED EMBODIMENT

<Related Semiconductor Device>

First, before describing the semiconductor device according to the embodiment of the present invention, a semiconductor device related thereto (hereinafter referred to as "related semiconductor device") will be described. Hereinafter, a configuration in which the first conductivity type is N-type and the second conductivity type is P-type will be described as an example. However, the present invention is not limited to this, and the first conductivity type may be P-type and the second conductivity type may be N-type.

Figure 1:
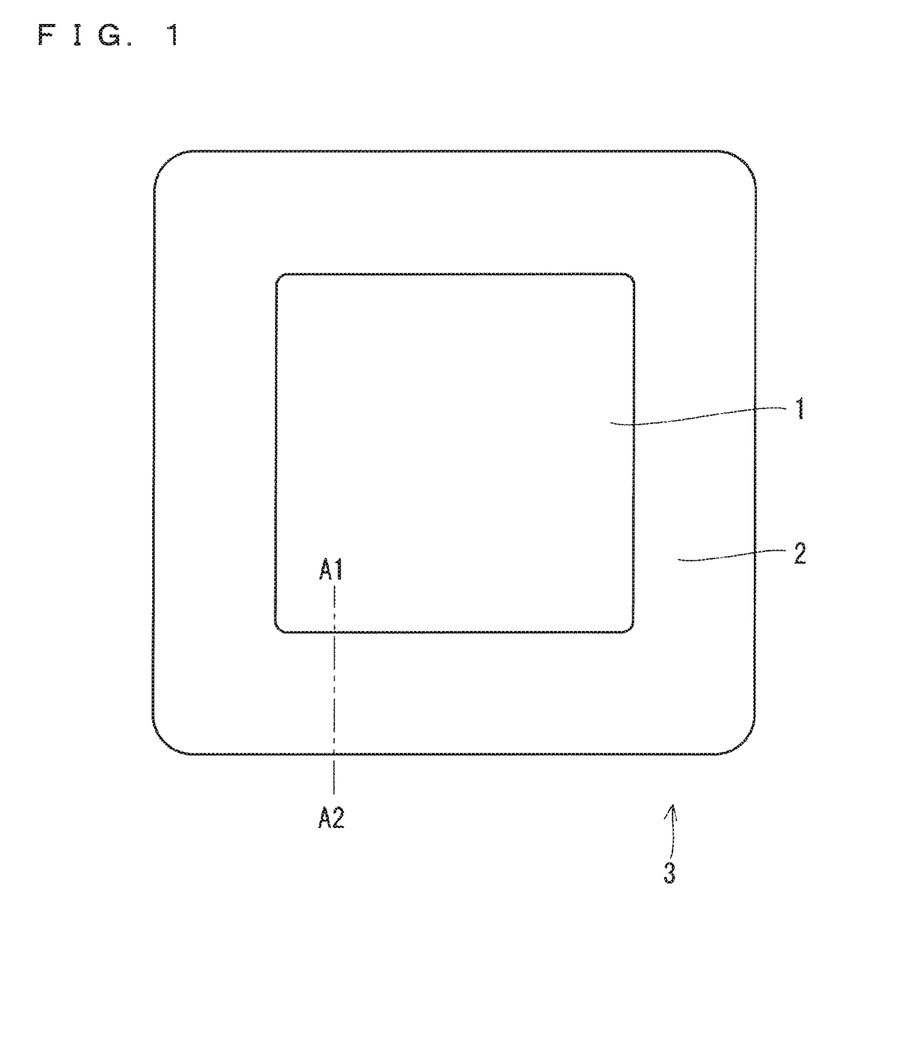
FIG. 1 is a plan view showing a configuration of a related semiconductor device.
Figure 2:
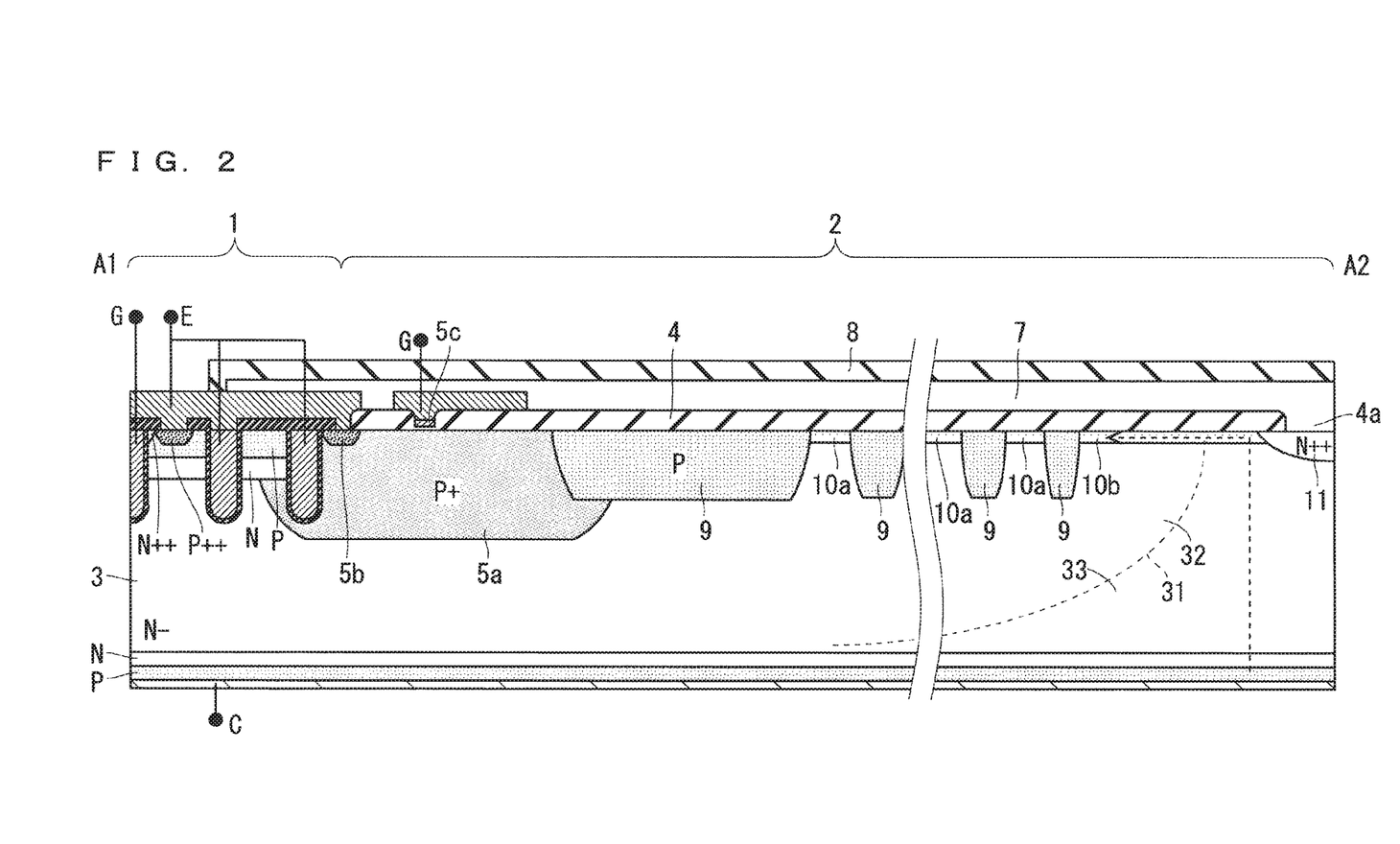
FIG. 2 is a cross-sectional view showing a configuration of the related semiconductor device.

FIG. 1 is a plan view showing a configuration of a related semiconductor device, and FIG. 2 is a cross-sectional view showing the configuration taken along line A1-A2 in FIG. 1.

As shown in FIGS. 1 and 2, the semiconductor substrate 3 has a front surface on which a cell portion 1 and a terminal portion 2 are defined. The cell portion 1 is disposed with semiconductor elements such as an insulated gate bipolar transistor (IGBT), a metal oxide semiconductor field effect transistor (MOSFET), a Schottky barrier diode (SBD), and a PN junction diode (PND). It should be noted that an IGBT is shown in FIG. 2 as an example of the semiconductor element.

The terminal portion 2 surrounds the cell portion 1. The terminal portion 2 is disposed with a structure for holding the withstand voltage of the related semiconductor device.

As shown in FIG. 2, the related semiconductor device includes the semiconductor substrate 3, an insulating film 4, a P+ layer 5a, a P++ layer 5b, a gate wiring line 5c, a semi-insulating film 7, an insulating film 8, a plurality of P layers 9, one or more P-layers 10a, a P-layer 10b, and an N++ layer 11. It should be noted that in FIG. 2, the boundary of the depletion layer 31 is shown, and with respect to this boundary, the cell portion 1 side is a high resistance region 32 and the N++ layer 11 side is a low resistance region 33.

The semiconductor substrate 3 has N-type, that is, includes N-type impurities. It should be noted that the semiconductor substrate 3 has only to generally include N-type impurities, and may partially include P-type impurities. The semiconductor substrate 3 may be made of a normal semiconductor wafer or may be made of an epitaxial growth layer.

The P+ layer 5a and the P++ layer 5b are disposed across the cell portion 1 and the terminal portion 2 of the semiconductor substrate 3. The gate wiring line 5c is disposed on the P+ layer 5a via the insulating film 4.

The N++ layer 11 being the first impurity layer is disposed to surround the cell portion 1 in the outer peripheral portion being the end portion on the side opposite to the cell portion 1 in the terminal portion 2 of the semiconductor substrate 3. The N++ layer 11 includes N-type impurities and has an N-type impurity concentration higher than that of the semiconductor substrate 3.

A plurality of P layers 9 being a plurality of second impurity layers are separated from each other and are disposed to surround the cell portion 1 in portions other than the outer peripheral portion in the terminal portion 2. The plurality of P layers 9 are disposed at a constant pitch, for example. It should be noted that the portion on the cell portion 1 side of the P layer 9 on the cell portion 1 side overlaps with the P+ layer 5a, and the range of the P layer 9 on the cell portion 1 side is larger than the ranges of the other P layers 9.

One or more P− layers 10a being one or more third impurity layers are disposed between the plurality of P layers 9 in the terminal portion 2. The P− layers 10a may be disposed in a portion between the P layers 9 adjacent to each other, may be disposed in the all portions between the P layers 9 adjacent to each other, and may be disposed to surround the cell portion 1. The P− layer 10a includes P-type impurities and has a P-type impurity concentration lower than that of the P layer 9. In addition, the depth of the P− layer 10a is smaller than the depth of the P layer 9.

The P− layer 10b is disposed in the entire portion between the outermost peripheral P layer 9 and the N++ layer 11 in the terminal portion 2, and is disposed in a state of being connected to the outermost peripheral P layer 9 and the N++ layer 11. The P− layer 10b may be disposed to surround the cell portion 1. The P− layer 10b includes P-type impurities and has a P-type impurity concentration lower than that of the P layer 9. In addition, the depth of the P− layer 10b is smaller than the depth of the P layer 9.

The insulating film 4 is disposed on at least a part of the terminal portion 2 and has a first opening 4a on the N++ layer 11. The semi-insulating film 7 is disposed on the insulating film 4 and connected to the N++ layer 11 via the first opening 4a. The insulating film 8 is disposed to cover the semi-insulating film 7.

Here, in the semiconductor device not including the P− layers 10a and 10b, due to the charges existing in the insulating film 4, the impurity concentration on the outermost front surface of the semiconductor substrate 3 in contact with the insulating film 4 increases. As a result, the extension of the depletion layer at the time of holding the withstand voltage is disturbed, and the withstand voltage is lowered.

On the other hand, in the related semiconductor device, the P− layers 10a and 10b can suppress an increase in the impurity concentration of the outermost front surface of the semiconductor substrate 3 in contact with the insulating film 4. Therefore, the depletion layer 31 at the time of holding the withstand voltage can be extended, and for example, a semiconductor device with a high withstand voltage class of 6500 V can be achieved.

Next, problems of the related semiconductor device will be described. When the mode of the related semiconductor device is the withstand voltage mode, the depletion layer 31 inside the semiconductor substrate 3 spreads from the front surface of the cell portion 1 toward the end of the semiconductor substrate 3, and when the depletion layer 31 reaches the end, the leakage current increases rapidly. Therefore, in the related semiconductor device, sufficiently increasing the size of the semiconductor substrate 3 prevents the depletion layer 31 from extending to the end of the semiconductor substrate 3. As a result, the outer peripheral portion or the like of the terminal portion 2 serves as a low resistance region 33 that does not serve as the depletion layer 31.

However, in the related semiconductor device, since the P− layer 10b is disposed in the entire portion between the outermost peripheral P layer 9 and the N++ layer 11 in the terminal portion 2, when the mode of the related semiconductor device is the withstand voltage mode, the P− layer 10b and the low resistance region 33 may be in contact with each other. When the P− layer 10b comes into contact with the low resistance region 33, a leakage current path reaching the cell portion 1 from the back surface of the semiconductor substrate 3 via the low resistance region 33, the P− layer 10b, the P layer 9, the P− layer 10a, and the like (broken arrow in FIG. 2) occurs.

As a result, the related semiconductor device has a problem that an increase in leakage current increases heat generation in the of state of the related semiconductor device and also increases energy loss. On the other hand, according to the semiconductor device according to the preferred embodiments described below, it is possible to solve such a problem.

First Preferred Embodiment

Figure 3:
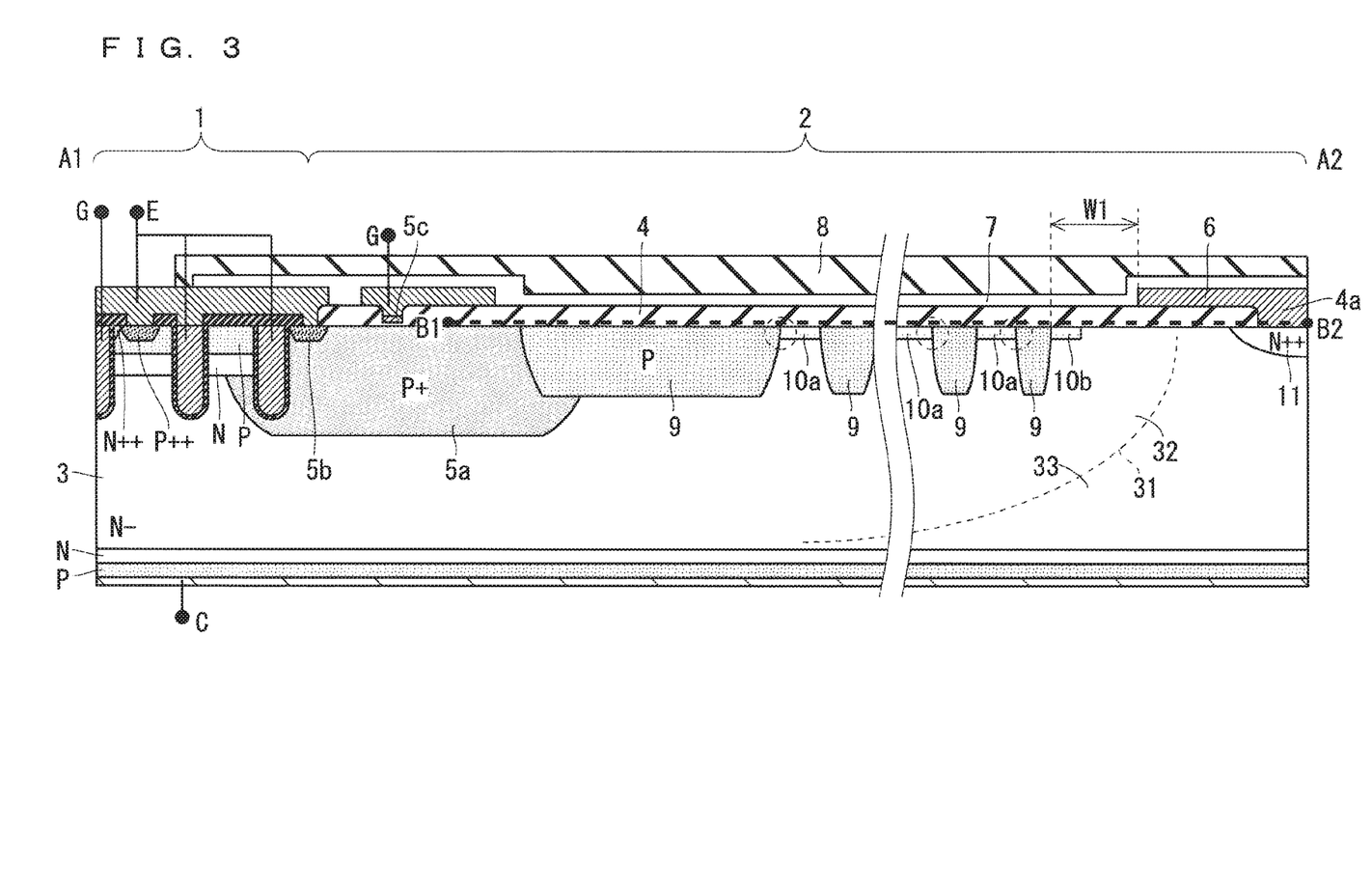
FIG. 3 is a cross-sectional view showing a configuration of a semiconductor device according to a first preferred embodiment.

FIG. 3 is a cross-sectional view showing the configuration of the semiconductor device according to the first preferred embodiment of the present invention, and corresponds to the cross-sectional view in FIG. 2. Hereinafter, among the components according to the present first preferred embodiment, components being the same as or similar to the components described above are described by the same or similar reference numerals, and different components be mainly described.

As shown in FIG. 3, in the present first preferred embodiment, the P− layer 10b being the fourth impurity layer is disposed in a state where, between the outermost peripheral P layer 9 and the N++ layer 11 in the terminal portion 2, the P− layer 10b is connected to the outermost peripheral P layer 9 but is separated from the N++ layer 11. That is, the N-type portion included in the semiconductor substrate 3 is sandwiched between the P− layer 10b and the N++ layer 11. It should be noted that the P− layer 10b is designed so that the end on the N++ layer 11 side of the P− layer 10b is sufficiently separated from the low resistance region 33 in the withstand voltage mode. In addition, the semiconductor device according to the present first preferred embodiment further includes an electrode 6. The electrode 6 is disposed on the insulating film 4 and connected to the N++ layer 11 via the first opening 4a.

According to the present first preferred embodiment as described above, the P− layer 10b is configured to be separated from the N++ layer 11. Therefore, since the P− layer 10b and the low resistance region 33 are prevented from being in contact with each other when the mode of the semiconductor device is the withstand voltage mode, the formation of leakage paths can be suppressed, and as a result, leakage current of the semiconductor device can be reduced.

In addition, as a countermeasure against the influence of external charges on the portion where the P− layer 10b is not formed, the present first preferred embodiment includes an electrode 6 disposed, via the insulating film 4, on the portion where the P− layer 10b is not formed. Since the electrode 6 is connected to the N++ layer 11 at the end of the chip, the electrode 6 can take the same potential as the power supply voltage. Due to the shielding effect of the electrode 6 caused thereby, the influence of external charges outside the semiconductor substrate 3 can be suppressed.

Figure 4:
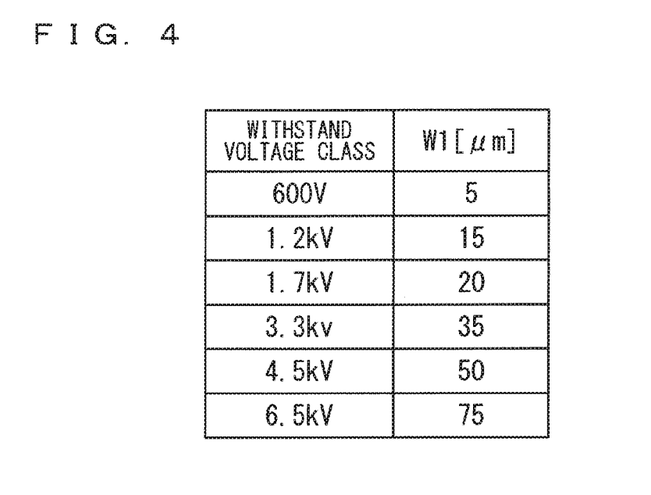
FIG. 4 is a diagram showing a relationship between a withstand voltage class and a distance.

Here, in the present first preferred embodiment, the distance W1 between the end on the electrode 6 side of the outermost peripheral P layer 9 and the end on the cell portion 1 side of the electrode 6 is 5 μm or more. According to this configuration, it is possible to suppress electric field concentration directly under the electrode 6 that occurs when the depletion layer 31 extends to the end on the cell portion 1 side of the electrode 6. It should be noted that the minimum value of the distance W1 may be changed depending on the withstand voltage class as shown in FIG. 4.

Figure 5:
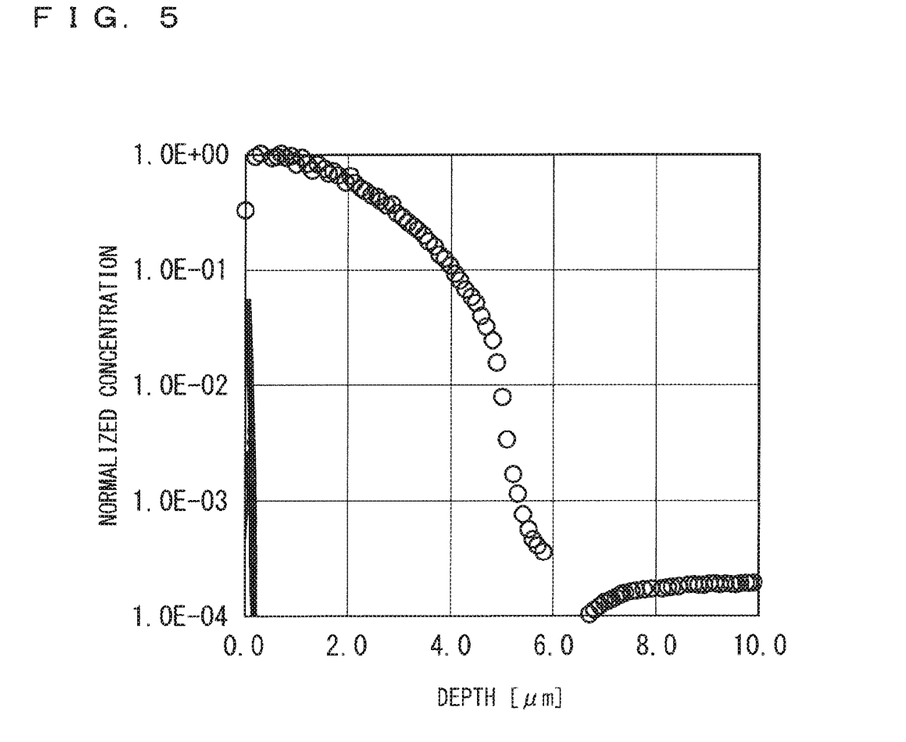
FIGS. 5 and 6 are diagrams each showing a profile of the semiconductor device according to the first preferred embodiment.
Figure 6:
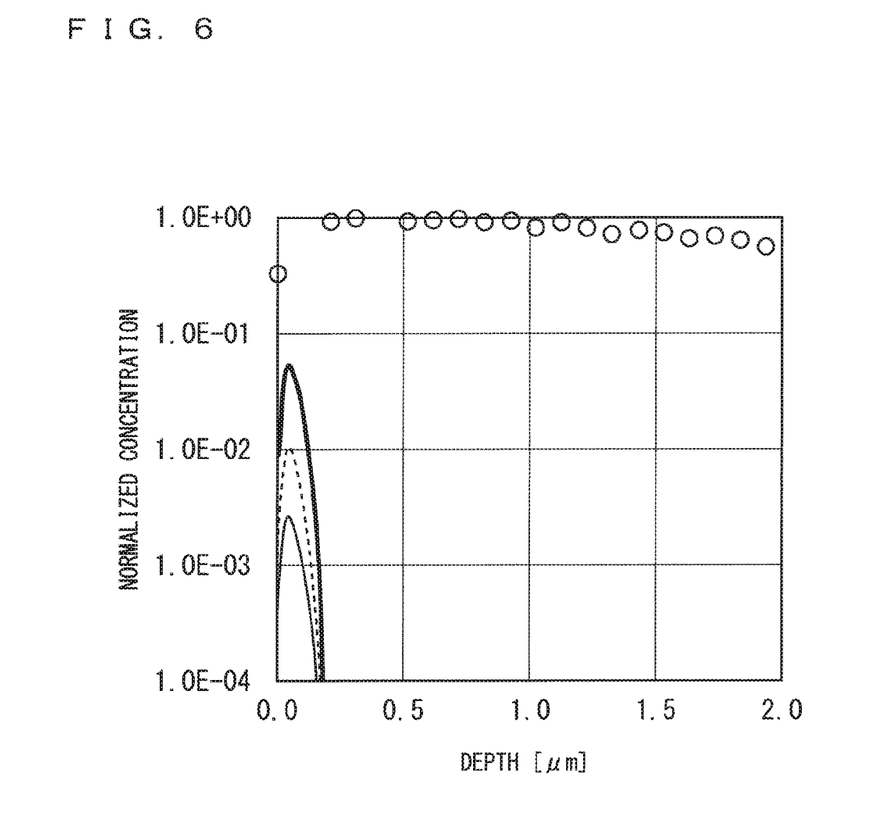

FIG. 5 is a diagram showing profiles of the P layer 9 and the P− layers 10a and 10b according to the present first preferred embodiment, and FIG. 6 is an enlarged view of a part in FIG. 5. In FIGS. 5 and 6, the circle mark indicates the profile of the P layer 9, the thick solid line indicates the profiles of the P− layers 10a and 10b whose concentration is high, the thin broken line indicates the profiles of the P− layers 10a and 10b whose concentration is in the middle, and the thin solid line indicates the profiles of the P− layers 10a and 10b whose concentration is low.

In the present first preferred embodiment, the P-type peak impurity concentration of the P− layers 10a and 10b is 0.001 or more and 0.1 or less times the P-type peak impurity concentration of the P layer 9, and the depth of P− layers 10a and 10b is 0.5 μm. When the peak impurity concentration and the depth of the P− layers 10a and 10b meet the above, it is possible to reduce an increase in the effective implantation amount required for forming the P− layers 10a and 10b, a bad influence on the withstand voltage such as a decrease in the withstand voltage, a reduction in the process margin of forming the P layer 9, and the like.

Figure 7:
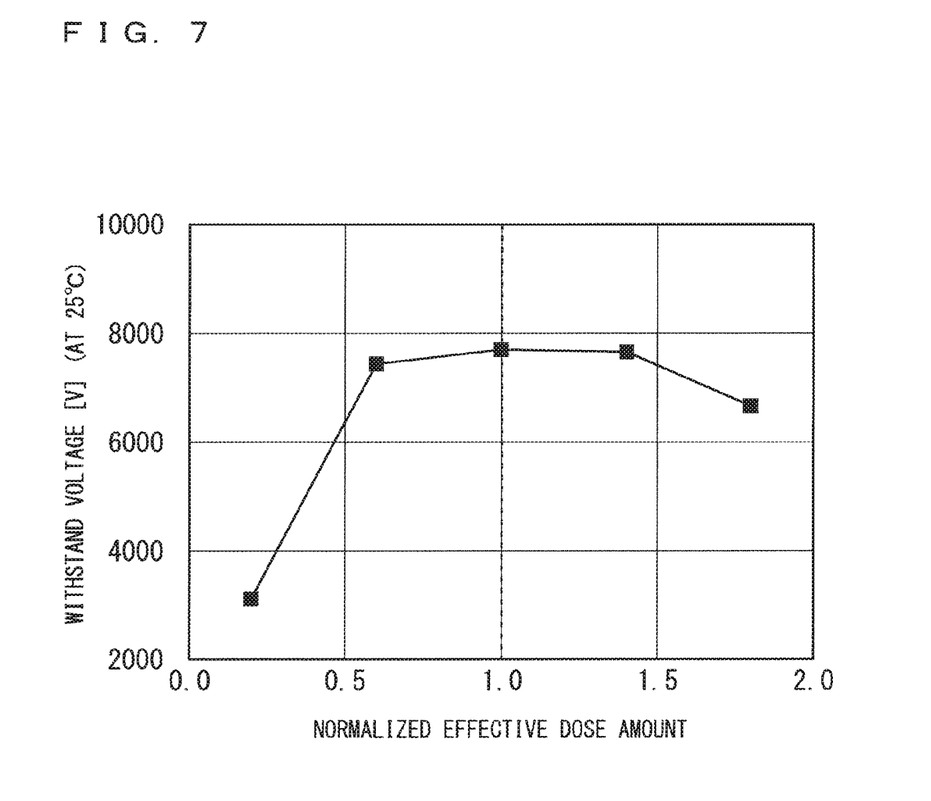
FIG. 7 is a diagram showing the correlation between the withstand voltage and the normalized effective dose amount.

FIG. 7 is a diagram showing the correlation between the withstand voltage and the normalized effective dose amount. The normalized effective dose amount is a value obtained by dividing the sum of the effective dose amount of the P layer 9 and the effective dose amount of the P− layers 10a and 10b by the optimum dose amount under the condition that the effective dose amount of the P layer 9>>the effective dose amount of the P− layers 10a and 10b holds. Here, in the present first preferred embodiment, as described above, the effective dose amount of the P− layers 10a and 10b (P-type impurity amount) is much smaller than the effective dose amount of the P layer 9 (P-type impurity amount). Therefore, these effective dose amounts can be set so that the effective dose amount of the P layer 9=the optimum dose amount holds without substantially considering the effective dose amounts of the P− layers 10a and 10b.

<Manufacturing Method>

Figure 8:
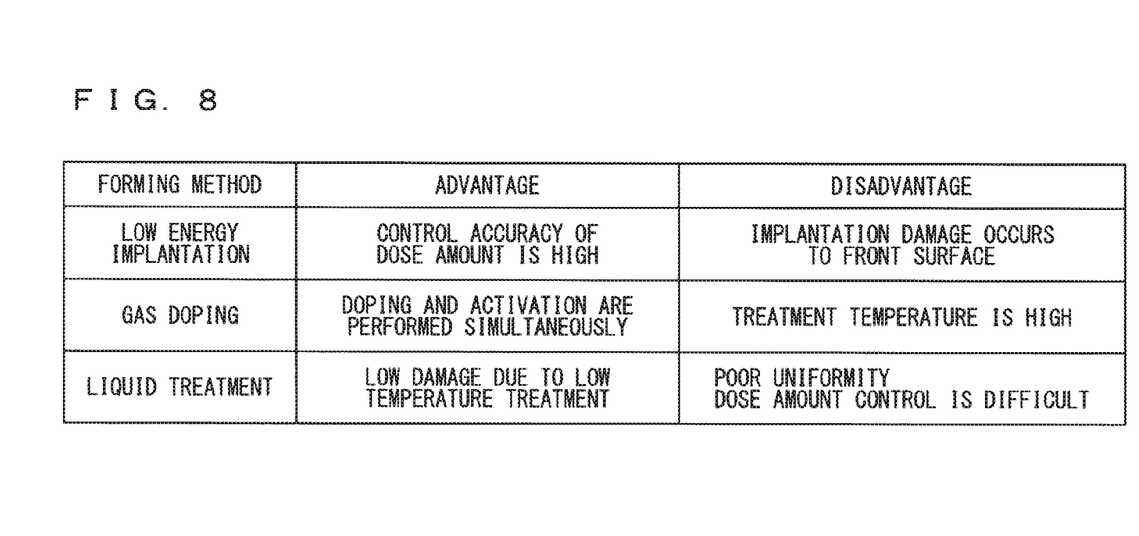
FIG. 8 is a diagram showing an example of a method for manufacturing the semiconductor device according to the first preferred embodiment.

For the formation of the P− layers 10a and 10b, low energy implantation using a rapid thermal process (RTP) of 50 keV or less, gas doping, liquid treatment, and the like are used, for example. Since each forming method has advantages and disadvantages as shown in FIG. 8, it is preferable to select any one of the forming methods in consideration of the specification, the manufacturing flow, the manufacturing environment, and the like of the semiconductor device.

Summary of First Preferred Embodiment

According to the semiconductor device according to the present first preferred embodiment as described above, the semiconductor device includes one or more P− layers 10a, a P− layer 10b separated from the N++ layer 11, and an electrode 6 disposed on the insulating film 4. According to this configuration, the withstand voltage of the semiconductor device can be increased and the leakage current can be reduced.

In addition, the distance W1 between the end on the electrode 6 side of the outermost peripheral P layer 9 and the end on the cell portion 1 side of the electrode 6 is 5 μm or more. According to this configuration, it is possible to suppress electric field concentration directly under the electrode 6 that occurs when the depletion layer 31 extends to the periphery of the electrode 6.

Second Preferred Embodiment

Figure 9:
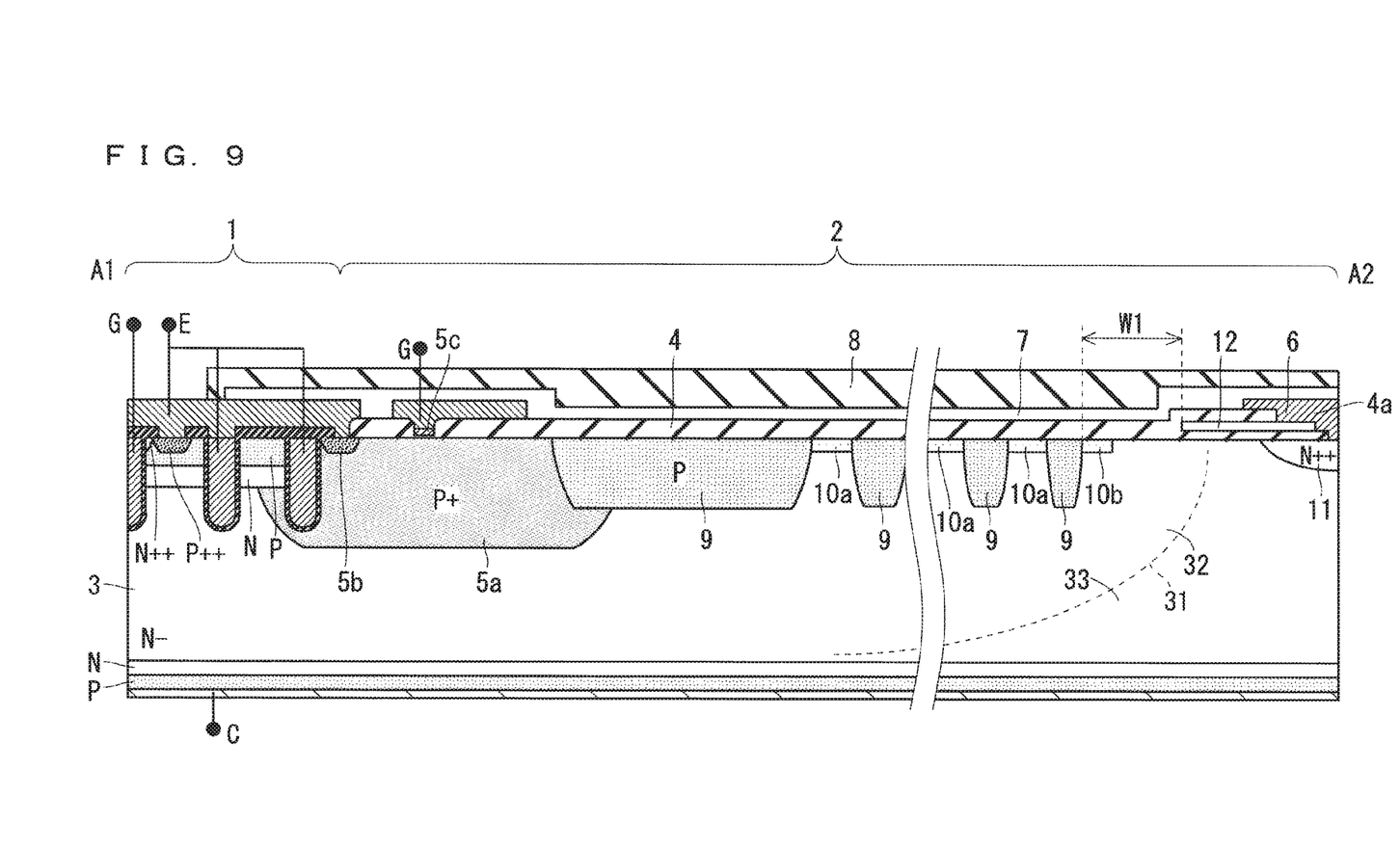
FIG. 9 is a cross-sectional view showing a configuration of a semiconductor device according to a second preferred embodiment.

FIG. 9 is a cross-sectional view showing e configuration of the semiconductor device according to the second preferred embodiment of the present invention, and corresponds to the cross-sectional view in FIG. 2. Hereinafter, among the components according to the present second preferred embodiment, components being the same as or similar to the components described above are denoted by the same or similar reference numerals, and different components will be mainly described.

The configuration of the semiconductor device according to the present second preferred embodiment in FIG. 9 is the same as the configuration in which the high-concentration polycrystalline semiconductor film 12 is added to the configuration of the semiconductor device according to the first preferred embodiment in FIG. 3. It should be noted that the concentration range of the polycrystalline semiconductor film 12 is 1E19 to 1E21 cm$^{-3}$, for example.

The polycrystalline semiconductor film 12 is disposed on the insulating film 4 on the periphery of the first opening 4a. The electrode 6 is disposed on the insulating film 4 and the polycrystalline semiconductor film 12 and connected to the polycrystalline semiconductor film 12. The distance W1 between the end on the polycrystalline semiconductor film 12 side of the outermost peripheral P layer 9 and the end on the cell portion 1 side of the polycrystalline semiconductor film 12 is 5 μm or more.

Summary of Second Preferred Embodiment

According to the semiconductor device according to the present second preferred embodiment as described above, since the semiconductor device includes components the same as those of the first preferred embodiment, the withstand voltage of the semiconductor device can be increased, and the leakage current can be reduced as in the first preferred embodiment.

In addition, according to the present second preferred embodiment, since the polycrystalline semiconductor film 12 generates an N-type accumulation layer on the front surface of the semiconductor substrate 3 in the vicinity of the polycrystalline semiconductor film 12 via the insulating film 4, unnecessary extension of the depletion layer 31 on the front surface can be stopped. Therefore, the width of the terminal portion 2 can be reduced. As a result, since the area of the semiconductor substrate 3 can be reduced, the chip cost can be reduced and the current density can be increased.

In addition, the distance W1 between the end on the electrode 6 side of the outermost peripheral P layer 9 and the end on the cell portion 1 side of the polycrystalline semiconductor film 12 is 5 μm or more. According to this configuration, it is possible to suppress electric field concentration directly under the polycrystalline semiconductor film 12 that occurs when the depletion layer 31 extends to the periphery of the polycrystalline semiconductor film 12.

Third Preferred Embodiment

Figure 10:
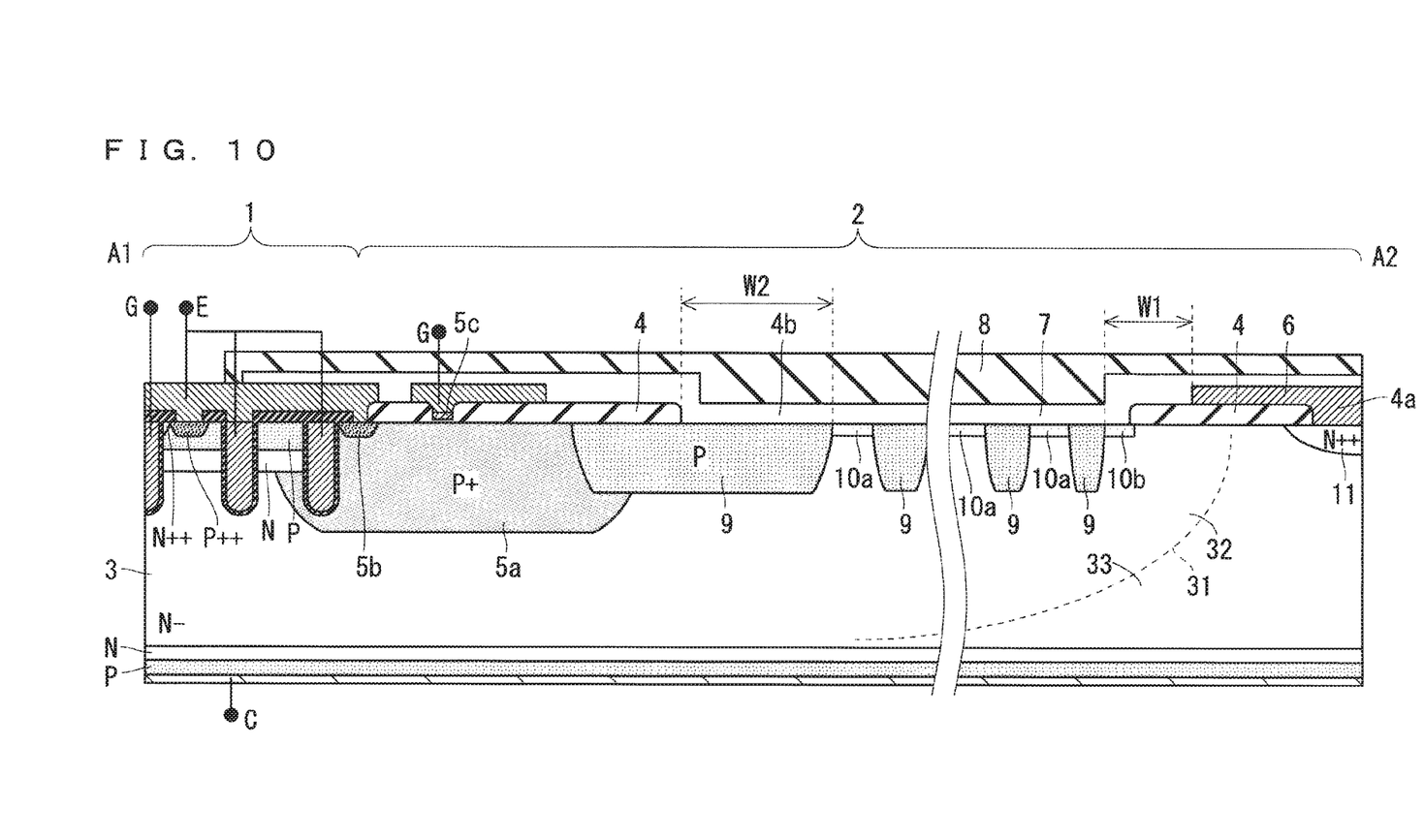
FIG. 10 is a cross-sectional view showing a configuration of a semiconductor device according to a third preferred embodiment.

FIG. 10 is a cross-sectional view showing the configuration of the semiconductor device according to the third preferred embodiment of the present invention, and corresponds to the cross-sectional view in FIG. 2. Hereinafter, among the components according to the present third preferred embodiment, components being the same as or similar to the components described above are denoted by the same or similar reference numerals, and different components will be mainly described.

In the present third preferred embodiment, the insulating film 4 not only has the first opening 4a, but has one second opening 4b on a plurality of P layers 9 unlike the first preferred embodiment. Then, the semi-insulating film 7 is connected to the plurality of P layers 9 via the second opening 4b.

Here, in the configuration in which the insulating film 4 exists on the P layer 9 as in the semiconductor device according to the first preferred embodiment (FIG. 3), there are cases where hot electrons are implanted into the insulating film 4 during continuous voltage application and the insulating film 4 is charged up, and in such a case, the withstand voltage may be deteriorated.

Figure 11:
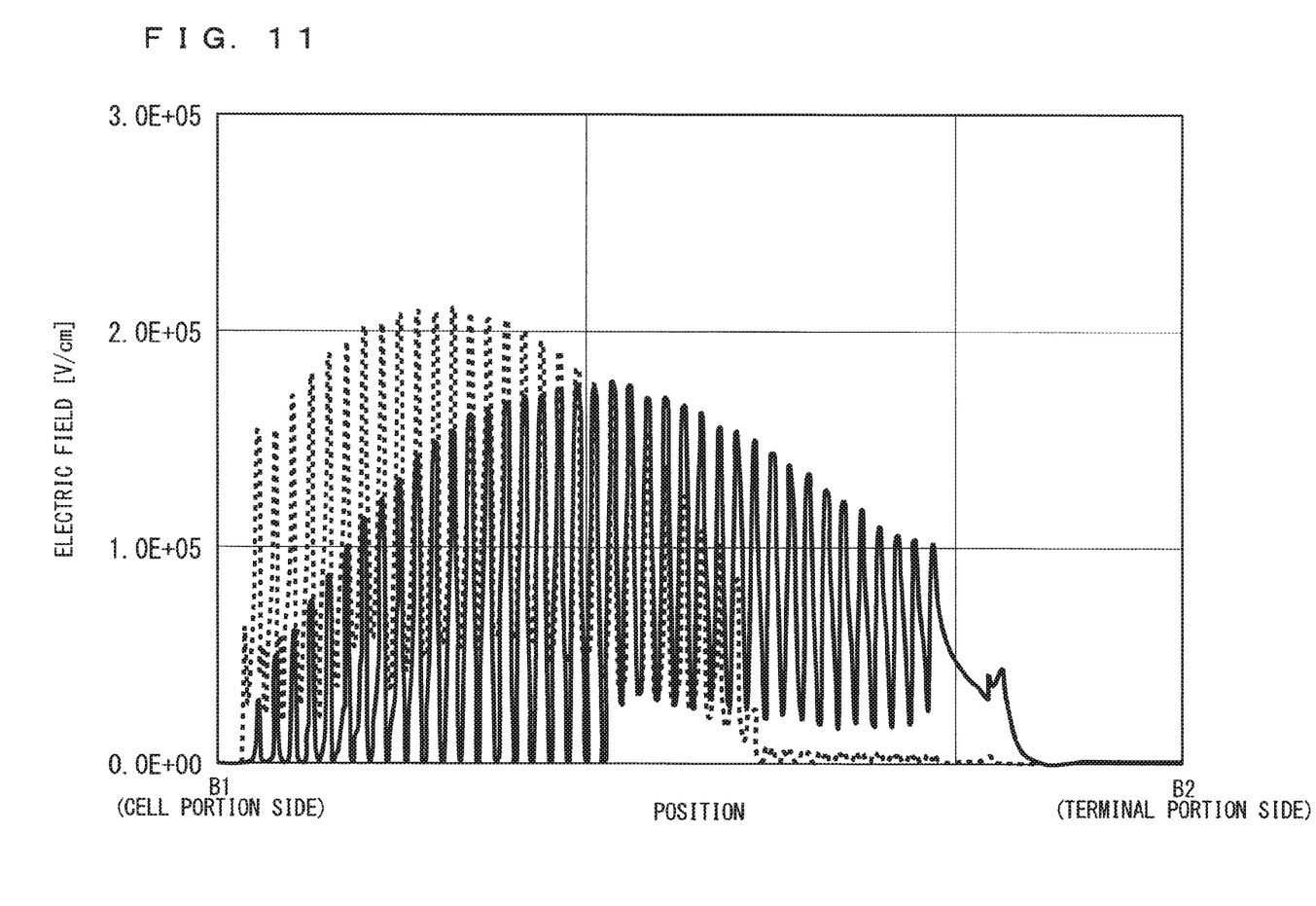
FIG. 11 is a diagram showing an electric field distribution of the semiconductor device according to the first preferred embodiment.

FIG. 11 is a diagram showing an electric field distribution on the front surface of the semiconductor substrate 3 of the semiconductor device (FIG. 3) according to the first preferred embodiment described above. It should be noted that the horizontal axis in FIG. 11 indicates the position taken along the line B1-B2 in FIG. 3. The solid line in FIG. 11 indicates the electric field distribution before the insulating film 4 is charged up, and the broken line indicates the electric field distribution after the insulating film 4 is charged up.

When a voltage is applied to the semiconductor device, the electric field concentrates on the ends on the cell portion 1 side of the P– layers 10a and 10b as shown by the broken-line circle mark in FIG. 3 and the solid line in FIG. 11. In this case, when hot electrons accelerated by a high electric field are implanted and accumulated in the insulating film 4 by a tunnel phenomenon, the charged-up insulating film 4 affects the electric field distribution inside the semiconductor substrate 3. As a result, as shown by the broken line in FIG. 11, the electric field is locally concentrated, which may cause avalanche breakdown and eventually the withstand voltage deterioration. It should be noted that in FIG. 11, the concentration of the electric field is shifted to the cell portion 1 side, but unlike this, there is also a case where the electric field concentration is shifted to the terminal portion 2 side.

On the other hand, in the semiconductor device according to the present third preferred embodiment, since the semi-insulating film 7, rather than the insulating film 4, is disposed on the P layer 9, it is possible to suppress the above-described withstand voltage deterioration.

In addition, in the present third preferred embodiment, the distance W2 between the end on the cell portion 1 side of the second opening 4b and the end on the cell portion 1 side of the P– layer 10a on the cell portion 1 side of the one or more P– layers 10a is larger than 0. According to this configuration, it is possible to further suppress the withstand voltage deterioration.

Summary of Third Preferred Embodiment

According to the semiconductor device according to the present third preferred embodiment as described above, since the semiconductor device includes components the same as those of the first preferred embodiment, the withstand voltage of the semiconductor device can be increased, and the leakage current can be reduced as in the first preferred embodiment.

In addition, according to the present third preferred embodiment, since the semi-insulating film 7 is connected to a plurality of P layers 9 via the second opening 4b, it is possible to suppress the withstand voltage deterioration due to hot electron implantation.

In addition, according to the present third preferred embodiment, since the distance W2 between the end on the cell portion 1 side of the second opening 4b and the end on the cell portion 1 side of the P– layer 10a on the cell portion 1 side of the one or more P– layers 10a is larger than 0, the withstand voltage deterioration can be further suppressed.

Modification of Third Preferred Embodiment

Figure 12:
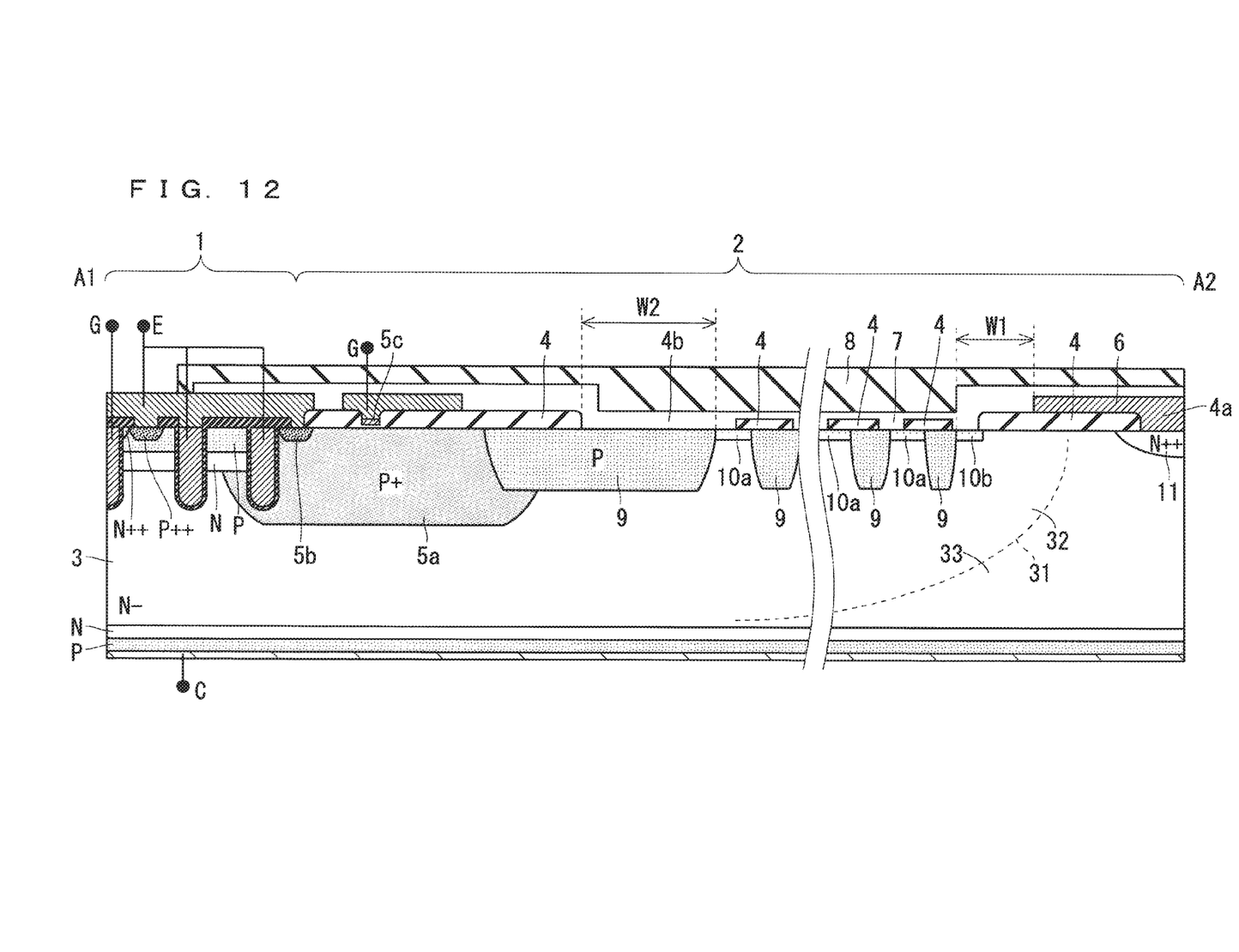
FIG. 12 is a cross-sectional view showing a configuration of a semiconductor device according to a modification of the third preferred embodiment.

In the third preferred embodiment, the insulating film 4 has one second opening 4b on the plurality of P layers 9. However, the insulating film 4 is not limited to this, and may have a plurality of second openings 4b on the plurality of P layers 9, respectively, as shown in FIG. 12. Specifically, the plurality of second openings 4b may be provided on the ends on the cell portion 1 side of the P– layers 10a and 10b where hot electrons are implanted. Then, the semi-insulating film 7 may be connected to the plurality of P layers 9 via the plurality of second openings 4b. Even in this case, as in the third preferred embodiment, it is possible to suppress the withstand voltage deterioration due to hot electron implantation.

Fourth Preferred Embodiment

Figure 13:
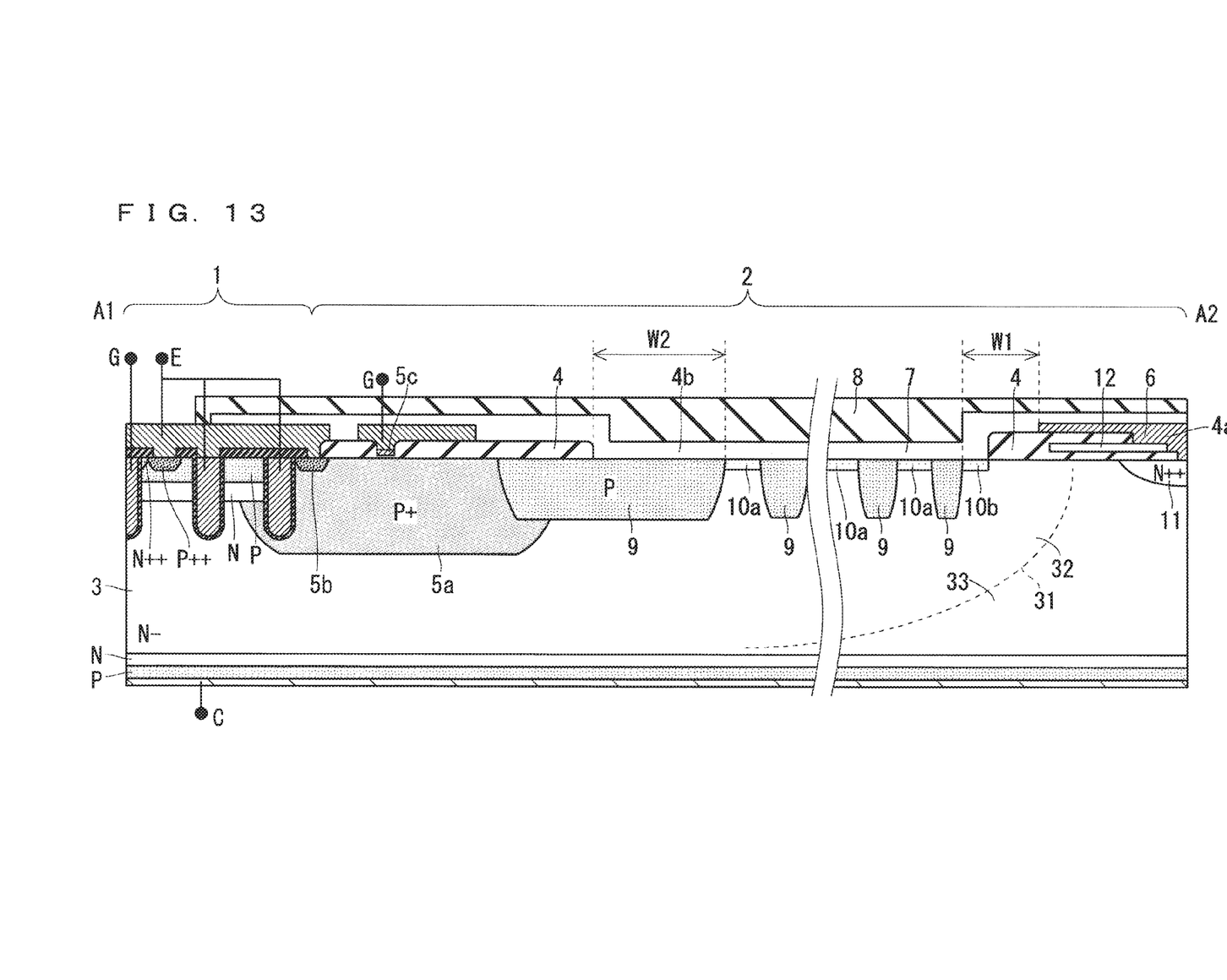
FIG. 13 is a cross-sectional view showing a configuration of a semiconductor device according to a fourth preferred embodiment.

FIG. 13 is a cross-sectional view showing the configuration of the semiconductor device according to the fourth preferred embodiment of the present invention, and corresponds to the cross-sectional view in FIG. 2. Hereinafter, among the components according to the present fourth preferred embodiment, components being the same as or similar to the components described above are denoted by the same or similar reference numerals, and different components will be mainly described.

The configuration of the semiconductor device according to the present fourth preferred embodiment is the same as the configuration obtained by combining the configuration of the semiconductor device according to the second preferred embodiment and the configuration of the semiconductor device according to the third preferred embodiment. That is, in the present fourth preferred embodiment, the polycrystalline semiconductor film 12 is disposed on the insulating film 4 on the periphery of the first opening 4a, and the electrode 6 is disposed on the insulating film 4 and the polycrystalline semiconductor film 12, and is connected to the polycrystalline semiconductor film 12. In addition, the insulating film 4 has a second opening 4b on a plurality of P layers 9, and the semi-insulating film 7 is connected to the plurality of P layers 9 via the second opening 4b.

According to this semiconductor device according to the present fourth preferred embodiment, the effect of the semiconductor device according to the second preferred embodiment and the effect of the semiconductor device according to the third preferred embodiment can be obtained.

It should be noted that in the present invention, each of the preferred embodiments and each of the modifications can be freely combined, and each of the preferred embodiments and each of the modifications can be appropriately modified or omitted within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate having a surface on which a cell portion and a terminal portion surrounding the cell portion are defined, the semiconductor substrate having a first conductivity type;
   a first impurity layer disposed to surround the cell portion in an end portion of the terminal portion opposite to the cell portion, the first impurity layer having a first conductivity type and having an impurity concentration higher than an impurity concentration of the semiconductor substrate;
   a plurality of second impurity layers separated from each other and disposed to surround the cell portion in a portion other than the end portion of the terminal portion, the plurality of second impurity layers having a second conductivity type;
   at least one third impurity layer disposed between the plurality of second impurity layers of the terminal portion, the at least one third impurity layer having a second conductivity type and having an impurity concentration lower than an impurity concentration of the second impurity layer;
   a fourth impurity layer disposed in a state of being connected to the outermost peripheral second impurity layer and being separated from the first impurity layer between the outermost peripheral second impurity layer and the first impurity layer of the terminal portion, the fourth impurity layer having a second conductivity type and having an impurity concentration lower than an impurity concentration of the second impurity layer;
   an insulating film disposed on at least a part of the terminal portion, the insulating film having a first opening on the first impurity layer; and
   an electrode disposed on the insulating film, the electrode connected to the first impurity layer via the first opening.

2. The semiconductor device according to claim 1, further comprising a polycrystalline semiconductor film disposed on the insulating film on a periphery of the first opening, and
   wherein the electrode is connected to the polycrystalline semiconductor film.

3. The semiconductor device according to claim 1, wherein an impurity concentration of a second conductivity type of the at least one third impurity layer and the fourth impurity layer is 0.001 times or more and 0.1 times or less an impurity concentration of a second conductivity type of the second impurity layers.

4. The semiconductor device according to claim 1, wherein a depth of the at least one third impurity layer and the fourth impurity layer is 0.5 µm or less.

5. The semiconductor device according to claim 1, wherein a distance between an end on the electrode side of the outermost peripheral second impurity layer and an end on the cell portion side of the electrode is 5 µm or more.

6. The semiconductor device according to claim 2, wherein a distance between an end on the polycrystalline semiconductor film side of the outermost peripheral second impurity layer and an end on the cell portion side of the polycrystalline semiconductor film is 5 µm or more.

7. The semiconductor device according to claim 1, wherein the insulating film further has a second opening on the plurality of second impurity layers, and
   further comprising a semi-insulating film connected to the plurality of second impurity layers via the second opening.

8. The semiconductor device according to claim 7, wherein a distance between an end on the cell portion side of the second opening and an end on the cell portion side of a third impurity layer on the cell portion side of the at least one third impurity layer is larger than 0.

* * * * *